United States Patent
Choi et al.

(10) Patent No.: US 8,729,796 B2
(45) Date of Patent: May 20, 2014

(54) ORGANIC LIGHT EMITTING DISPLAY DEVICE INCLUDING A GAP TO IMPROVE IMAGE QUALITY AND METHOD OF FABRICATING THE SAME

(75) Inventors: Dong-Soo Choi, Suwon-si (KR); Jin-Woo Park, Suwon-si (KR); Hee-Seong Jeong, Suwon-si (KR); Hyun-Sook Park, Suwon-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 399 days.

(21) Appl. No.: 11/529,891

(22) Filed: Sep. 29, 2006

(65) Prior Publication Data

US 2007/0170855 A1 Jul. 26, 2007

(51) Int. Cl.
*H01L 51/50* (2006.01)
*H01L 51/52* (2006.01)

(52) U.S. Cl.
CPC ........ *H01L 51/5246* (2013.01); *H01L 51/5281* (2013.01)
USPC .......................................... 313/512; 313/504

(58) Field of Classification Search
CPC .................. H01L 51/5246; H01L 51/5281
See application file for complete search history.

(56) References Cited

U.S. PATENT DOCUMENTS

| | | |
|---|---|---|
| 3,966,449 A | 6/1976 | Foster |
| 4,004,936 A | 1/1977 | Powell |
| 4,105,292 A | 8/1978 | Conder et al. |
| 4,238,704 A | 12/1980 | Bonk et al. |
| 4,702,566 A | 10/1987 | Tukude |
| 4,826,297 A | 5/1989 | Kubo et al. |
| 4,984,059 A | 1/1991 | Kubota et al. |
| 5,610,742 A | 3/1997 | Hinata et al. |

(Continued)

FOREIGN PATENT DOCUMENTS

| | | |
|---|---|---|
| CN | 1290121 A | 4/2001 |
| CN | 1438825 | 8/2003 |

(Continued)

OTHER PUBLICATIONS

Machine translation of JP10-0745883 published Mar. 17, 1998.*

(Continued)

*Primary Examiner* — Britt D Hanley
(74) *Attorney, Agent, or Firm* — Knobbe Martens Olson & Bear LLP

(57) ABSTRACT

Provided is an organic light emitting display device (OLED) for preventing Newton's rings to improve image quality. An organic light emitting display device according to one embodiment of the present invention comprises a first substrate comprising a single layer or multiple layers; a second substrate comprising a single layer or multiple layers, the second substrate comprising an inner surface facing the first substrate; an array of organic light emitting pixels formed on the first substrate and interposed between the first and second substrates, the array comprising a top surface opposing the inner surface of the second substrate, wherein the top surface and the inner surface has a gap therebetween, and the gap has a gap distance measured between the top surface and the inner surface; and a frit seal interconnecting the first and second substrates while surrounding the array, wherein the frit seal, the first substrate and the second substrate in combination define an enclosed space in which the array is located, wherein the frit seal has a height between the first and second substrates so as to form the gap distance equal to or greater than about 10 μm.

20 Claims, 7 Drawing Sheets

(56) References Cited

U.S. PATENT DOCUMENTS

| | | |
|---|---|---|
| 5,687,465 A | 11/1997 | Hinata et al. |
| 5,808,719 A | 9/1998 | Fujiwara et al. |
| 5,811,927 A | 9/1998 | Anderson et al. |
| 5,965,907 A | 10/1999 | Huang et al. |
| 6,005,653 A | 12/1999 | Matsuzawa |
| 6,057,647 A * | 5/2000 | Kurosawa et al. ............ 313/506 |
| 6,087,717 A | 7/2000 | Ano et al. |
| 6,195,142 B1 | 2/2001 | Gyotoku et al. |
| 6,210,815 B1 | 4/2001 | Ooishi |
| 6,211,938 B1 | 4/2001 | Mori |
| 6,236,444 B1 | 5/2001 | Konuma et al. |
| 6,288,487 B1 | 9/2001 | Arai |
| 6,424,009 B1 | 7/2002 | Ju |
| 6,452,323 B1 | 9/2002 | Byrum et al. |
| 6,472,087 B1 | 10/2002 | Otani et al. |
| 6,489,719 B1 | 12/2002 | Young et al. |
| 6,495,262 B2 | 12/2002 | Igeta |
| 6,515,417 B1 | 2/2003 | Duggal et al. |
| 6,551,724 B2 | 4/2003 | Ishii et al. |
| 6,554,672 B2 | 4/2003 | Dunham et al. |
| 6,555,025 B1 | 4/2003 | Krupetsky et al. |
| 6,565,400 B1 | 5/2003 | Lee et al. |
| 6,590,337 B1 | 7/2003 | Nishikawa et al. |
| 6,603,254 B1 | 8/2003 | Ando |
| 6,605,826 B2 | 8/2003 | Yamazaki et al. |
| 6,624,572 B1 | 9/2003 | Kim et al. |
| 6,646,284 B2 | 11/2003 | Yamazaki et al. |
| 6,650,392 B2 | 11/2003 | Iwanaga et al. |
| 6,660,547 B2 | 12/2003 | Guenther |
| 6,671,029 B1 | 12/2003 | Choi |
| 6,717,052 B2 | 4/2004 | Wang et al. |
| 6,744,199 B1 | 6/2004 | Tanaka |
| 6,791,660 B1 | 9/2004 | Hayashi et al. |
| 6,831,725 B2 | 12/2004 | Niiya |
| 6,833,668 B1 | 12/2004 | Yamada et al. |
| 6,861,801 B2 | 3/2005 | Kim et al. |
| 6,878,467 B2 | 4/2005 | Chung et al. |
| 6,896,572 B2 | 5/2005 | Park et al. |
| 6,914,661 B2 | 7/2005 | Masuda et al. |
| 6,924,594 B2 | 8/2005 | Ogura et al. |
| 6,936,963 B2 | 8/2005 | Langer et al. |
| 6,956,324 B2 | 10/2005 | Yamazaki |
| 6,956,638 B2 | 10/2005 | Akiyama et al. |
| 6,965,195 B2 | 11/2005 | Yamazaki et al. |
| 6,980,275 B1 | 12/2005 | Konuma et al. |
| 6,993,537 B2 | 1/2006 | Buxton et al. |
| 6,998,776 B2 * | 2/2006 | Aitken et al. ................. 313/512 |
| 7,023,518 B1 | 4/2006 | Koyama et al. |
| 7,030,558 B2 | 4/2006 | Park et al. |
| 7,098,589 B2 | 8/2006 | Erchak et al. |
| 7,112,115 B1 | 9/2006 | Yamazaki et al. |
| 7,141,925 B2 | 11/2006 | Wittmann et al. |
| 7,154,218 B2 | 12/2006 | Murakami et al. |
| 7,178,927 B2 | 2/2007 | Seo |
| 7,186,020 B2 | 3/2007 | Taya et al. |
| 7,187,121 B2 | 3/2007 | Hasegawa et al. |
| 7,193,218 B2 | 3/2007 | Nagano |
| 7,193,364 B2 | 3/2007 | Klausmann et al. |
| 7,193,366 B2 | 3/2007 | Tomimatsu et al. |
| 7,202,602 B2 | 4/2007 | Anandan |
| 7,211,938 B2 | 5/2007 | Tanaka |
| 7,214,429 B2 | 5/2007 | Kato et al. |
| 7,247,986 B2 | 7/2007 | Kang et al. |
| 7,255,823 B1 | 8/2007 | Guenther et al. |
| 7,291,977 B2 | 11/2007 | Kim et al. |
| 7,306,346 B2 | 12/2007 | Fukuoka et al. |
| 7,317,281 B2 | 1/2008 | Hayashi et al. |
| 7,332,858 B2 | 2/2008 | Nomura et al. |
| 7,342,357 B2 | 3/2008 | Sakano et al. |
| 7,344,901 B2 | 3/2008 | Hawtof et al. |
| 7,359,021 B2 | 4/2008 | Ota et al. |
| 7,371,143 B2 | 5/2008 | Becken et al. |
| 7,393,257 B2 | 7/2008 | Spencer et al. |
| 7,407,423 B2 | 8/2008 | Aitken et al. |
| 7,423,375 B2 | 9/2008 | Guenther et al. |
| 7,425,166 B2 | 9/2008 | Burt et al. |
| 7,425,518 B2 | 9/2008 | Yoshida et al. |
| 7,426,010 B2 | 9/2008 | Lee et al. |
| 7,452,738 B2 | 11/2008 | Hayashi et al. |
| 7,474,375 B2 | 1/2009 | Kwak et al. |
| 7,498,186 B2 | 3/2009 | Lee |
| 7,514,280 B2 | 4/2009 | Lee |
| 7,528,544 B2 | 5/2009 | Kwak et al. |
| 7,537,504 B2 | 5/2009 | Becken et al. |
| 7,564,185 B2 | 7/2009 | Song et al. |
| 7,579,203 B2 | 8/2009 | Yamazaki et al. |
| 7,579,220 B2 | 8/2009 | Ohnuma et al. |
| 7,585,022 B2 | 9/2009 | Achilles et al. |
| 7,586,254 B2 | 9/2009 | Kwak et al. |
| 7,597,603 B2 | 10/2009 | Becken et al. |
| 7,821,197 B2 | 10/2010 | Lee |
| 7,825,594 B2 | 11/2010 | Lee et al. |
| 7,834,550 B2 | 11/2010 | Lee et al. |
| 7,837,530 B2 | 11/2010 | Park |
| 7,944,143 B2 | 5/2011 | Choi et al. |
| 8,038,495 B2 | 10/2011 | Lee et al. |
| 2001/0030730 A1 | 10/2001 | Iwanaga et al. |
| 2002/0024051 A1 | 2/2002 | Yamazaki et al. |
| 2003/0066311 A1 | 4/2003 | Li et al. |
| 2003/0077396 A1 | 4/2003 | Lecompte et al. |
| 2003/0184221 A1 * | 10/2003 | Mishima ........................ 313/512 |
| 2003/0222061 A1 | 12/2003 | Langer et al. |
| 2003/0227252 A1 | 12/2003 | Ikeya et al. |
| 2004/0069017 A1 | 4/2004 | Li et al. |
| 2004/0075380 A1 | 4/2004 | Takemoto et al. |
| 2004/0104655 A1 | 6/2004 | Kodera et al. |
| 2004/0135520 A1 | 7/2004 | Park et al. |
| 2004/0169033 A1 | 9/2004 | Kuibira et al. |
| 2004/0169174 A1 | 9/2004 | Huh et al. |
| 2004/0201348 A1 | 10/2004 | Anandan |
| 2004/0206953 A1 * | 10/2004 | Morena et al. .................. 257/40 |
| 2004/0207314 A1 | 10/2004 | Aitken et al. |
| 2005/0046338 A1 * | 3/2005 | Park ............................. 313/504 |
| 2005/0088595 A1 | 4/2005 | Akiyama et al. |
| 2005/0092927 A1 | 5/2005 | Nagano |
| 2005/0110404 A1 * | 5/2005 | Park et al. ...................... 313/512 |
| 2005/0127820 A1 | 6/2005 | Yamazaki et al. |
| 2005/0218396 A1 | 10/2005 | Tsuchiya et al. |
| 2005/0231107 A1 | 10/2005 | Yamazaki et al. |
| 2005/0233885 A1 | 10/2005 | Yoshida et al. |
| 2005/0248270 A1 | 11/2005 | Ghosh et al. |
| 2005/0275342 A1 | 12/2005 | Yanagawa |
| 2006/0082298 A1 | 4/2006 | Becken et al. |
| 2006/0084348 A1 * | 4/2006 | Becken et al. .................. 445/25 |
| 2006/0284556 A1 | 12/2006 | Tremel et al. |
| 2006/0290261 A1 | 12/2006 | Sawai et al. |
| 2007/0120478 A1 | 5/2007 | Lee et al. |
| 2007/0170324 A1 | 7/2007 | Lee et al. |
| 2007/0170423 A1 | 7/2007 | Choi et al. |
| 2007/0170605 A1 | 7/2007 | Lee et al. |
| 2007/0170839 A1 | 7/2007 | Choi et al. |
| 2007/0170845 A1 | 7/2007 | Choi et al. |
| 2007/0170850 A1 | 7/2007 | Choi et al. |
| 2007/0170857 A1 | 7/2007 | Choi et al. |
| 2007/0170859 A1 | 7/2007 | Choi et al. |
| 2007/0170860 A1 | 7/2007 | Choi et al. |
| 2007/0170861 A1 | 7/2007 | Lee et al. |
| 2007/0171637 A1 | 7/2007 | Choi |
| 2007/0172971 A1 | 7/2007 | Boroson |
| 2007/0173167 A1 | 7/2007 | Choi |
| 2007/0176549 A1 | 8/2007 | Park |
| 2007/0177069 A1 | 8/2007 | Lee |
| 2007/0197120 A1 | 8/2007 | Lee |
| 2007/0232182 A1 | 10/2007 | Park |
| 2008/0057260 A1 | 3/2008 | Buchhauser et al. |
| 2008/0074036 A1 | 3/2008 | Wang et al. |

FOREIGN PATENT DOCUMENTS

| | | |
|---|---|---|
| CN | 1459996 (A) | 12/2003 |
| CN | 1551686 A | 12/2004 |
| CN | 1577413 | 2/2005 |
| CN | 1592508 (A) | 3/2005 |
| CN | 161636 | 5/2005 |

(56) References Cited

FOREIGN PATENT DOCUMENTS

| | | |
|---|---|---|
| CN | 1617636 A | 5/2005 |
| CN | 1212662 | 7/2005 |
| CN | 1212662 C | 7/2005 |
| CN | 1670570 | 9/2005 |
| EP | 1 058 311 A2 | 12/2000 |
| EP | 1 582 914 A1 | 10/2005 |
| EP | 1 777 748 | 4/2007 |
| JP | 030-37933 | 2/1991 |
| JP | 04-147217 | 5/1992 |
| JP | 04-301879 | 10/1992 |
| JP | 06-34983 | 2/1994 |
| JP | 06-337429 | 10/1994 |
| JP | 07-74583 | 3/1995 |
| JP | 09-258671 A * | 3/1997 |
| JP | 09-278483 | 10/1997 |
| JP | 10-74583 | 3/1998 |
| JP | 10-074583 | 3/1998 |
| JP | 10-125463 | 5/1998 |
| JP | 10-161137 | 6/1998 |
| JP | 63-163423 | 7/1998 |
| JP | 10-201585 | 8/1998 |
| JP | 11-007031 | 1/1999 |
| JP | 11-202349 | 7/1999 |
| JP | 2000-173780 (A) | 6/2000 |
| JP | 2001-022293 | 1/2001 |
| JP | 2001-052858 | 2/2001 |
| JP | 2001-55527 | 2/2001 |
| JP | 2001-203076 | 2/2001 |
| JP | 2001-110564 | 4/2001 |
| JP | 2001-155855 (A) | 6/2001 |
| JP | 2001-230072 | 8/2001 |
| JP | 2001-319775 | 11/2001 |
| JP | 2002 020169 | 1/2002 |
| JP | 2002-93576 | 3/2002 |
| JP | 2002-100472 | 4/2002 |
| JP | 2002 117777 | 4/2002 |
| JP | 2002 170664 | 6/2002 |
| JP | 2002-216951 | 8/2002 |
| JP | 2002-280169 | 9/2002 |
| JP | 2002-318547 | 10/2002 |
| JP | 2001-324662 | 11/2002 |
| JP | 2002-359070 | 12/2002 |
| JP | 2003-123966 | 4/2003 |
| JP | 2003-228302 | 8/2003 |
| JP | 2003 243160 | 8/2003 |
| JP | 2003 297552 | 10/2003 |
| JP | 2003-332061 | 11/2003 |
| JP | 2004 29552 | 1/2004 |
| JP | 2004 070351 | 3/2004 |
| JP | 04-151656 | 5/2004 |
| JP | 2004 303733 | 10/2004 |
| JP | 2004 319103 | 11/2004 |
| JP | 2005-049808 | 2/2005 |
| JP | 2005-71984 | 3/2005 |
| JP | 2005-112676 | 4/2005 |
| JP | 2005-510831 | 4/2005 |
| JP | 2005-123089 | 5/2005 |
| JP | 2005-134476 (A) | 5/2005 |
| JP | 2005 158672 | 6/2005 |
| JP | 2005 190683 | 7/2005 |
| JP | 2005-216746 | 8/2005 |
| JP | 2005-222807 | 8/2005 |
| JP | 2005 251415 | 9/2005 |
| JP | 2005 258405 | 9/2005 |
| JP | 2005-267991 (A) | 9/2005 |
| JP | 2005-302707 | 10/2005 |
| JP | 2005-302738 | 10/2005 |
| JP | 2005 340020 | 12/2005 |
| JP | 2006 524419 | 10/2006 |
| KR | 10-1995-0009817 | 4/1995 |
| KR | 10-1998-0017583 | 6/1998 |
| KR | 10-2000-0045292 A | 7/2000 |
| KR | 10-2001-0079597 | 8/2001 |
| KR | 10-2001-0084380 | 9/2001 |
| KR | 10-2002-0051153 | 6/2002 |
| KR | 10-2003-0044656 | 6/2003 |
| KR | 10-2003-0089447 | 11/2003 |
| KR | 10-2004-0011138 | 2/2004 |
| KR | 10-2005-070543 | 7/2005 |
| KR | 10-2005-0076664 | 7/2005 |
| KR | 10-2005-0112318 | 11/2005 |
| KR | 10-2005-0115408 | 12/2005 |
| KR | 10-2006-0005369 A | 1/2006 |
| KR | 10-2006-0006148 | 1/2006 |
| KR | 10-2006-0006149 | 1/2006 |
| KR | 10-2006-0007025 | 1/2006 |
| KR | 10-2006-0007353 | 1/2006 |
| KR | 10-2006-0007354 | 1/2006 |
| KR | 10-2006-0007889 | 1/2006 |
| KR | 10-2006-0007890 | 1/2006 |
| KR | 10-2006-0007892 | 1/2006 |
| KR | 10-2006-0007893 | 1/2006 |
| KR | 10-2006-0007962 | 1/2006 |
| KR | 10-2006-0007963 | 1/2006 |
| KR | 10-2006-0008462 | 1/2006 |
| KR | 10-2006-0008463 | 1/2006 |
| KR | 10-2006-0008464 | 1/2006 |
| KR | 10-2006-0008761 | 1/2006 |
| KR | 10-2006-0008769 | 1/2006 |
| KR | 10-2006-0011831 | 2/2006 |
| KR | 10-2006-0016188 | 2/2006 |
| KR | 10-2006-0016316 | 2/2006 |
| KR | 10-2006-0016446 | 2/2006 |
| KR | 10-2006-0016856 | 2/2006 |
| KR | 10-2006-0016857 | 2/2006 |
| KR | 10-2006-0020109 | 3/2006 |
| KR | 10-2006-0025755 | 3/2006 |
| KR | 10-2006-0026816 | 3/2006 |
| KR | 10-2006-0027321 | 3/2006 |
| KR | 10-2006-0028571 | 3/2006 |
| KR | 10-2006-0035455 | 4/2006 |
| TW | 508976 | 11/2002 |
| TW | 517356 (B) | 1/2003 |
| TW | 564563 | 12/2003 |
| TW | 569166 | 1/2004 |
| TW | I227094 | 1/2005 |
| TW | 1228686 | 3/2005 |
| TW | VI237218 | 8/2005 |
| TW | 200541379 | 12/2005 |
| TW | 200541382 | 12/2005 |
| TW | 200601873 | 1/2006 |
| TW | 11277125 | 3/2007 |
| WO | WO 02/21557 | 3/2002 |
| WO | WO 03/005774 | 1/2003 |
| WO | WO 2004-095597 | 4/2004 |
| WO | WO 2004/094331 | 11/2004 |
| WO | WO 2004/112160 | 12/2004 |
| WO | WO 2005/050751 | 6/2005 |
| WO | WO 2006/045067 | 4/2006 |

OTHER PUBLICATIONS

Office Action Issued on Dec. 19, 2008 in Corresponding Chinese Patent Application No. 2007100072531 With its English Translation—13 pages.

Office Action from corresponding Korean Patent Application No. 10-2006-0007963.

Chinese Office Action and English translation in corresponding Patent Application No. 200710000143.2 dated Sep. 26, 2008.

Chinese Office Action issued Oct. 10, 2008 in corresponding Patent Application No. 2007100040808.

Chinese Office Action issued Aug. 1, 2008 Patent Application No. 200710001301.6 with English translation.

Chinese Office Action issued Oct. 10, 2008 in Corresponding Patent Application No. 200710003941.0 with its English translation—11 pages.

Chinese Office Action issued Oct. 10, 2008 in Patent Application No. 200710001782.0.

Chinese Office Action issued on Aug. 1, 2008 in corresponding Patent Application No. 2007100015717 (w/English translation) in 19 pages.

Chinese Rejection Decision issued on May 8, 2009 in the corresponding Patent Application No. 200710004080.8.

(56) References Cited

OTHER PUBLICATIONS

Chinese Office Action issued on Jan. 8, 2010 in corresponding Patent Application No. 200710003941.0.
European Search Report from the corresponding European Patent Application No. 07101294.2 dated Jun. 6, 2007.
European Search Report from the corresponding European Patent Application No. 07101295.9 dated May 24, 2007.
Japanese Office Action dated Dec. 1, 2009 for Japanese Patent Application No. 2006-193033, which claims priority of the corresponding Korean priority Application No. 10-2006-0007893.
Japananese Office Action mailed Jun. 30, 2009 for Japanese Application No. 2006-222065.
Japanese Office Action dated Jul. 28, 2009 of the Japanese Patent Application No. 2006-153567, which claims priority of the corresponding Korean priority application No. 10-2006-0008462.
Japanese Office Action for Patent Application No. 2006-1930232 mailed May 19, 2009.
Japanese Office Action issued on May 19, 2009 in the corresponding Japanese Patent Application No. 2006-189628.
Japanese Office Action issued on Oct. 20, 2009 in the corresponding Japanese Patent Application No. 2006-189628.
Japanese Office Action issued on Oct. 27, 2009 in the corresponding Japanese Patent Application No. 2006-256002.
Japanese Office Action re Patent Application No. 2006-193034 mailed May 19, 2009.
Korean Notice of Allowance issued Aug. 2, 2007 in counterpart Korean Patent Application No. 10-2006-0016188.
Korean Notice of Allowance issued Jul. 3, 2007 in counterpart Korean Patent Application No. 10-2006-0035455.
Korean Office Action from corresponding Patent Application No. 10-2006-0006148 dated Sep. 26, 2006.
Korean Office Action from corresponding Patent Application No. 10-2006-0007890, dated Sep. 26, 2006.
Korean Office Action issued Feb. 12, 2007 in counterpart Korean Patent Application No. 10-2006-0035455.
U.S. Office Action dated Feb. 2, 2009 in U.S. Appl. No. 11/529,916.
U.S. Office Action dated Apr. 3, 2009 in U.S. Appl. No. 11/541,055.
U.S. Office Action dated Aug. 19, 2009 in U.S. Appl. No. 11/529,915.
U.S. Office Action dated Dec. 31, 2009 in U.S. Appl. No. 11/541,139
U.S. Office Action dated Nov. 5, 2009 in U.S. Appl. No. 11/541,047.
U.S. Office Action dated Nov. 28, 2007 in U.S. Appl. No. 11/540,150.
U.S. Office Action dated Aug. 21, 2008 in U.S. Appl. No. 11/540,150.
U.S. Office Action dated Nov. 15, 2007 in U.S. Appl. No. 11/541,009.
U.S. Office Action dated Jun. 19, 2008 in U.S. Appl. No. 11/541,009.
U.S. Office Action dated Dec. 3, 2008 in U.S. Appl. No. 11/541,009.
U.S. Office Action dated Apr. 30, 2009 in U.S. Appl. No. 11/540,151.
U.S. Office Action dated Feb. 11, 2009 in U.S. Appl. No. 11/529,883.
U.S. Office Action dated Jul. 17, 2009 in U.S. Appl. No. 11/529,883.
U.S. Office Action dated Dec. 30, 2009 in U.S. Appl. No. 11/541,048.
U.S. Office Action dated Dec. 8, 2008 in U.S. Appl. No. 11/540,021.
U.S. Office Action dated Apr. 27, 2009 in U.S. Appl. No. 11/540,021.
U.S. Office Action dated Feb. 19, 2009 in U.S. Appl. No. 11/540,024.
U.S. Office Action dated May 4, 2009 in U.S. Appl. No. 11/529,995.
U.S. Office Action dated May 8, 2009 in U.S. Appl. No. 11/540,149.
Japan Office Action dated Jul. 28, 2009 of the Japanese Patent Application No. 2006-153567.
Japan Office Action dated Jul. 28, 2009 of the Japanese Patent Application No. 2006 178508.
Japan Office Action dated Jul. 14, 2009 of the Japanese Patent Application No. 2006-151960.
Japan Office Action dated Jul. 14, 2009 of the Japanese Patent Application No. 2006-165210.
Japanese Office Action issued Sep. 8, 2009 in Japanese Patent Application 2007-011996.
U.S. Appl. No. 11/540,024, filed Sep. 29, 2006, Published as 2007/0170605 on Jul. 26, 2007, and its ongoing prosecution history, including without limitation Office Actions, Amendments, Remarks, and any other potentially relevant documents
U.S. Appl. No. 11/540,149, filed Sep. 20, 2006, Published as 2007/0170324 on Jul. 26, 2007, and its ongoing prosecution history, including without limitation Office Actions, Amendments, Remarks, and any other potentially relevant documents.
U.S. Appl. No. 11/540,021, filed Sep. 29, 2006, Published as 2007/0170423 on Jul. 26, 2007, and its ongoing prosecution history, including without limitation Office Actions, Amendments, Remarks, and any other potentially relevant documents.
U.S. Appl. No. 11/541,047, filed Sep. 29, 2006, Published as 2007/0170839 on Jul. 26, 2007, and its ongoing prosecution history, including without limitation Office Actions, Amendments, Remarks, and any other potentially relevant documents.
U.S. Appl. No. 11/541,139, filed Sep. 29, 2006, Published as 2007/0170845 on Jul. 26, 2007, and its ongoing prosecution history, including without limitation Office Actions, Amendments, Remarks, and any other potentally relevant documents.
U.S. Appl. No. 11/529,916, filed Sep. 29, 2006, Published as 2007/0170850 on Jul. 26, 2007, and its ongoing prosecution history, including without limitation Office Actions, Amendments, Remarks, and any other potentially relevant documents.
U.S. Appl. No. 11/529,914, filed Sep. 29, 2006, Published as 2007/0170857 on Jul. 26, 2007, and its ongoing prosecution history, including without limitation Office Actions, Amendments, Remarks, and any other potentially relevant documents.
U.S. Appl. No. 11/540,103, filed Sep. 29, 2006, Published as 2007/0170857 on Jul. 26, 2007, and its ongoing prosecution history, including without limitation Office Actions, Amendments, Remarks, and any other potentially relevant documents.
U.S. Appl. No. 11/540,151, filed Sep. 29, 2006, Published as 2007/0170859 on Jul. 26, 2007, and its ongoing prosecution history, including without limitaton Office Actions, Amendments, Remarks, and any other potentially relevant documents.
U.S. Appl. No. 11/540,157, filed Sep. 29, 2006, Published as 2007/0170860 on Jul. 26, 2007, and its ongoing prosecution history, including without limitation Office Actions, Amendments, Remarks, and any other potentially relevant documents.
U.S. Appl. No. 11/529,995, filed Sep. 29, 2006, Published as 2007/0171637 on Jul. 26, 2007, and its ongoing prosecution history, including without limitation Office Actions, Amendments, Remarks, and any other potentially relevant documents.
U.S. Appl. No. 11/541,055, filed Sep. 29, 2006, Published as 2007/0173167 on Jul. 26, 2007, and its ongoing prosecution history, including without limitation Office Actions, Amendments, Remarks, and any other potentially relevant documents.
U.S. Appl. No. 11/541,009, filed Sep. 29, 2006, Published as 2007/0167549 on Aug 2, 2007, and its ongoing prosecution history, including without limitation Office Actions, Amendments, Remarks, and any other potentially relevant documents.
U.S. Appl. No. 11/541,048, filed Sep. 29, 2006, Published as 2007/0177069 on Aug. 2, 2007, and its ongoing prosecution history, including without limitation Office Actions, Amendments, Remarks, and any other potentially relevant documents.
U.S. Appl. No. 11/529,883, filed Sep. 29, 2006, Published as 2007/0197120 on Aug. 23, 2007, and its ongoing prosectuion history, including without limitation Office Actions, Amendments, Remarks, and any other potentially relevant documents.
U.S. Appl. No. 11/540,008, filed Sep. 29, 2006, Published as 2007/0232182 on Oct. 4, 2007, and its ongoing prosecution history, including without limitation Office Actions, Amendments, Remarks, and any other potentially relevant documents.
U.S. Appl. No. 11/540,150, filed Sep. 29, 2006, and its ongoing prosecution history, including without limitation Office Actions, Amendments, Remarks, and any other potentially relevant documents.
Japanese Office Action dated Jun. 1, 2010 of the Japanese Patent Application No. 2006-193032, which claims priority of the corresponding Korean priority application No. 10-2006-0006148.
Japanese Office Action dated Jun. 15, 2010 of the Japanese Patent Application No. 2006-151960, which claims priority of the corresponding Korean priority application No. 10-2006-0008761.
Taiwanese Office Action issued Jan. 18, 2010 from corresponding TW Application No. 95145107 (which claims priority to KR App. No. 10-2006-0008463).
Taiwanese Office Action Issued Apr. 2, 2010 from corresponding TW Application No. 95144932.

(56) References Cited

OTHER PUBLICATIONS

U.S. Office Action dated Mar. 29, 2010 in U.S. Appl. No. 11/541,055.
U.S. Office Action (Advisory Action) dated May 19, 2010 in U.S. Appl. No. 11/529,914.
U.S. Office Action dated May 25, 2010 in U.S. Appl. No. 11/529,995.
U.S. Office Action dated Nov. 29, 2010 in U.S. Appl. No. 11/529,916.
U.S. Office Action dated Aug. 19, 2010 in U.S. Appl. No. 11/529,914.
European Search Report from the corresponding European Patent Application No. 07250311.3 dated Sep. 24, 2010.
Japanese Office Action dated Feb. 14, 2012 for Japanese Patent Application No. JP 2006-256002 which shares priority of Korean Patent Application No. KR 10-2006-0007963 with captioned U.S. Appl. No. 11/529,891.
Taiwanese Office Action dated Dec. 22, 2011 for Taiwanese Patent Application No. TW 096101663 which shares priority of Korean Patent Application No. KR 10-2006-0007963 with captioned U.S. Appl. No. 11/529,891.
Office Action dated Aug. 7, 2012 for U.S. Appl. No. 11/540,150, filed Sep. 29, 2006, which is related to captioned U.S. Appl. No. 11/529,891.
Taiwan Office Action dated Jun. 29, 2012 for Taiwan Patent Application No. TW 096101663 which shares priority of Korean Patent Application No. KR 10-2006-0007963 with captioned U.S. Appl. No. 11/529,891.
Examination Report dated Nov. 18, 2013 for European Patent Application No. EP 07 250 311.3 which shares priority of Korean Patent Application No. KR 10-2006-0007963 with captioned U.S. Appl. No. 11/529,891.
U.S. Office Action dated Sep. 17, 2013 in U.S. Appl. No. 13/858,883, filed Apr. 8, 2013.

\* cited by examiner

ORGANIC LIGHT EMITTING DISPLAY DEVICE INCLUDING A GAP TO IMPROVE IMAGE QUALITY AND METHOD OF FABRICATING THE SAME

CROSS-REFERENCE TO RELATED APPLICATION

This application claims priority to and the benefit of Korean Patent Application No. 10-2006-0007963, filed Jan. 25, 2006, the disclosure of which is incorporated herein by reference in its entirety. This application is related to and incorporates herein by reference the entire contents of the following concurrently filed applications:

| Title | Filing Date | Application No. |
|---|---|---|
| ORGANIC LIGHT-EMITTING DISPLAY DEVICE AND METHOD OF FABRICATING THE SAME | Sep. 29, 2006 | 11/541,055 |
| ORGANIC LIGHT-EMITTING DISPLAY DEVICE AND METHOD OF MANUFACTURING THE SAME | Sep. 29, 2006 | 11/529,914 |
| ORGANIC LIGHT EMITTING DISPLAY DEVICE | Sep. 29, 2006 | 11/541,139 |
| ORGANIC LIGHT-EMITTING DISPLAY DEVICE WITH FRIT SEAL AND REINFORCING STRUCTURE | Sep. 29, 2006 | 11/541,047 |
| ORGANIC LIGHT EMITTING DISPLAY DEVICE METHOD OF FABRICATING THE SAME | Sep. 29, 2006 | 11/540,150 |
| ORGANIC LIGHT EMITTING DISPLAY AND METHOD OF FABRICATING THE SAME | Sep. 29, 2006 | 11/541,009 |
| ORGANIC LIGHT-EMITTING DISPLAY DEVICE WITH FRIT SEAL AND REINFORCING STRUCTURE BONDED TO FRAME | Sep. 29, 2006 | 11/540,151 |
| METHOD FOR PACKAGING ORGANIC LIGHT EMITTING DISPLAY WITH FRIT SEAL AND REINFORCING STRUCTURE | Sep. 29, 2006 | 11/529,910 |
| METHOD FOR PACKAGING ORGANIC LIGHT EMITTING DISPLAY WITH FRIT SEAL AND REINFORCING STRUCTURE | Sep. 29, 2006 | 11/540,084 |
| ORGANIC LIGHT-EMITTING DISPLAY DEVICE AND THE PREPARATION METHOD OF THE SAME | Sep. 29, 2006 | 11/540,008 |
| ORGANIC LIGHT EMITTING DISPLAY AND FABRICATING METHOD OF THE SAME | Sep. 29, 2006 | 11/541,048 |
| ORGANIC LIGHT-EMITTING DISPLAY AND METHOD OF MAKING THE SAME | Sep. 29, 2006 | 11/540,021 |
| ORGANIC LIGHT EMITTING DISPLAY AND FABRICATING METHOD OF THE SAME | Sep. 29, 2006 | 11/540,024 |
| ORGANIC LIGHT EMITTING DISPLAY DEVICE AND MANUFACTURING METHOD THEREOF | Sep. 29, 2006 | 11/529,995 |
| ORGANIC LIGHT-EMITTING DISPLAY DEVICE AND MANUFACTURING METHOD OF THE SAME | Sep. 29, 2006 | 11/540,157 |
| ORGANIC LIGHT EMITTING DISPLAY AND FABRICATING METHOD OF THE SAME | Sep. 29, 2006 | 11/540,149 |
| ORGANIC LIGHT EMITTING DISPLAY AND METHOD OF FABRICATING THE SAME | Sep. 29, 2006 | 11/529,916 |
| ORGANIC LIGHT EMITTING DISPLAY AND METHOD OF FABRICATING THE SAME | Sep. 29, 2006 | 11/540,103 |

BACKGROUND

1. Field of the Invention

The present invention relates to organic light emitting display devices and, more particularly, to packaging such devices.

2. Description of the Related Art

In recent years, flat panel display devices (FPDs), such as liquid crystal display devices (LCDs), organic light emitting display devices (OLEDs), and plasma display panels (PDPs), have attracted much attention in order to solve the problems of conventional display devices, such as cathode ray tubes (CRTs). Since the LCD is a non-emissive device, the LCD has technical limits in brightness, contrast, viewing angle, and size. Also, the PDP is an emissive display, but the PDP is heavier, consumes more power, and is more complex to manufacture in comparison with other FPDs.

On the other hand, the OLED is an emissive device that is excellent in viewing angle and contrast. Therefore, the OLED can be made lightweight and thin since a separate light source, i.e., a back light is not required, unlike in the LCD, and consumes less power than the CRT. Furthermore, the OLED can be driven at a low DC voltage and has a fast response speed. Also, since the OLED is fabricated using only solid materials, the OLED is highly resistant to external shock, can be used in a wide range of temperature, and is simple and inexpensive to manufacture.

SUMMARY OF CERTAIN INVENTIVE ASPECTS

An aspect of the invention provides an organic light emitting display device, which may comprise: a first substrate comprising a single layer or multiple layers; a second substrate comprising a single layer or multiple layers, the second substrate comprising an inner surface facing the first substrate; an array of organic light emitting pixels formed on the first substrate and interposed between the first and second substrates, the array comprising a top surface opposing the inner surface of the second substrate, wherein the top surface and the inner surface has a gap therebetween, and the gap has a gap distance measured between the top surface and the inner surface; and a frit seal interconnecting the first and second substrates while surrounding the array, wherein the frit seal, the first substrate and the second substrate in combination define an enclosed space in which the array is located, wherein the frit seal has a height between the first and second substrates so as to form the gap distance equal to or greater than about 10 μm.

In the foregoing device, the gap distance may be about 10 to about 300 μm. The gap distance may be from about 10 to about 100 μm. The gap distance may be from about 10 to about 30 μm. The array may be configured to emit visible light through the top surface. The height may be the shortest distance between the first and second substrates, wherein the height may be from about 10 to about 300 μm. The second substrate may comprise a display surface facing away from the first substrate and configured to display an image thereon, and wherein the device may be configured to display an image on the display surface substantially free of Newton's rings. The array may comprise a first electrode, a second electrode and at least one organic layer interposed therebetween, wherein the second electrode may be closer to the second substrate than the first electrode, and wherein the top surface may comprise a surface of the second electrode facing the second substrate. The array may comprise a first electrode, a second electrode and at least one organic layer interposed therebetween, wherein the second electrode may be closer to the second substrate than the first electrode, wherein the array may further comprise a substantially transparent layer formed on the second electrode, and wherein the top surface may comprise a surface of the substantially transparent layer which faces the second substrate. The gap may comprise an air gap. The gap may be substantially filled with a solid material. The frit seal may comprise one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

Another aspect of the invention provides an organic light emitting display device, which may comprises: a first substrate; a second substrate comprising an inner surface facing the first substrate; and an array of organic light emitting pixels formed on the first substrate, the array comprising a top surface opposing the inner surface of the second substrate, wherein the top surface and the inner surface has a gap therebetween from about 10 to about 300 μm.

In the foregoing device, the device may further comprises a frit seal interconnecting the first and second substrates while surrounding the array, wherein the frit seal, the first substrate and the second substrate in combination may define an enclosed space in which the array is located. The frit seal may have a height between the first and second substrate, and wherein the height is from about 2 to about 300 μm.

Still another aspect of the invention provides a method of making an organic light emitting display device, which may comprise: providing an unfinished device comprising a first substrate and an array of organic light emitting pixels formed on the first substrate, the array comprising a top surface facing away from the first substrate; arranging a second substrate over the unfinished device so as to interpose the array between the first and second substrates with a gap between the top surface and the second substrate, the gap having a gap distance; and forming a frit seal between and interconnecting the first and second substrates while surrounding the array such that the gap distance is equal to or greater than about 10 μm.

In the foregoing method, forming the frit seal may comprise interposing a frit material between the first and second substrate, and bonding the frit material to the first and second substrate so as to form a substantially hermetic seal. Bonding may comprise melting and solidifying the frit material. The frit seal may have a height measured between the first and second substrate, wherein the height may be from about 2 to about 300 μm. The gap distance is about 10 to about 300 μm. The gap distance may be from about 10 to about 30 μm. The second substrate may comprise a display surface facing away from the first substrate and configured to display an image thereon, and wherein the organic light emitting device may be configured to display an image on the display surface substantially free of Newton's rings.

Still in the foregoing method, the unfinished device may further comprise a plurality of additional arrays of organic light emitting pixels formed on the first substrate, wherein the method may further comprise forming a plurality of additional seals between and interconnecting the first and second substrates, wherein a first one of the additional seals may surround a first one of the additional arrays. The first additional array and the second substrate may form a gap therebetween with a gap distance equal to or greater than about 10 μm. The method may further comprise cutting the unfinished device into two pieces.

BRIEF DESCRIPTION OF THE DRAWINGS

The above and other features of the present invention will be described in reference to certain exemplary embodiments thereof with reference to the attached drawings in which.

DETAILED DESCRIPTION OF EMBODIMENTS

The present invention will now be described more fully hereinafter with reference to the accompanying drawings, in which exemplary embodiments of the invention are shown.

An organic light emitting display (OLED) is a display device comprising an array of organic light emitting diodes. Organic light emitting diodes are solid state devices which include an organic material and are adapted to generate and emit light when appropriate electrical potentials are applied.

Figure 7A:
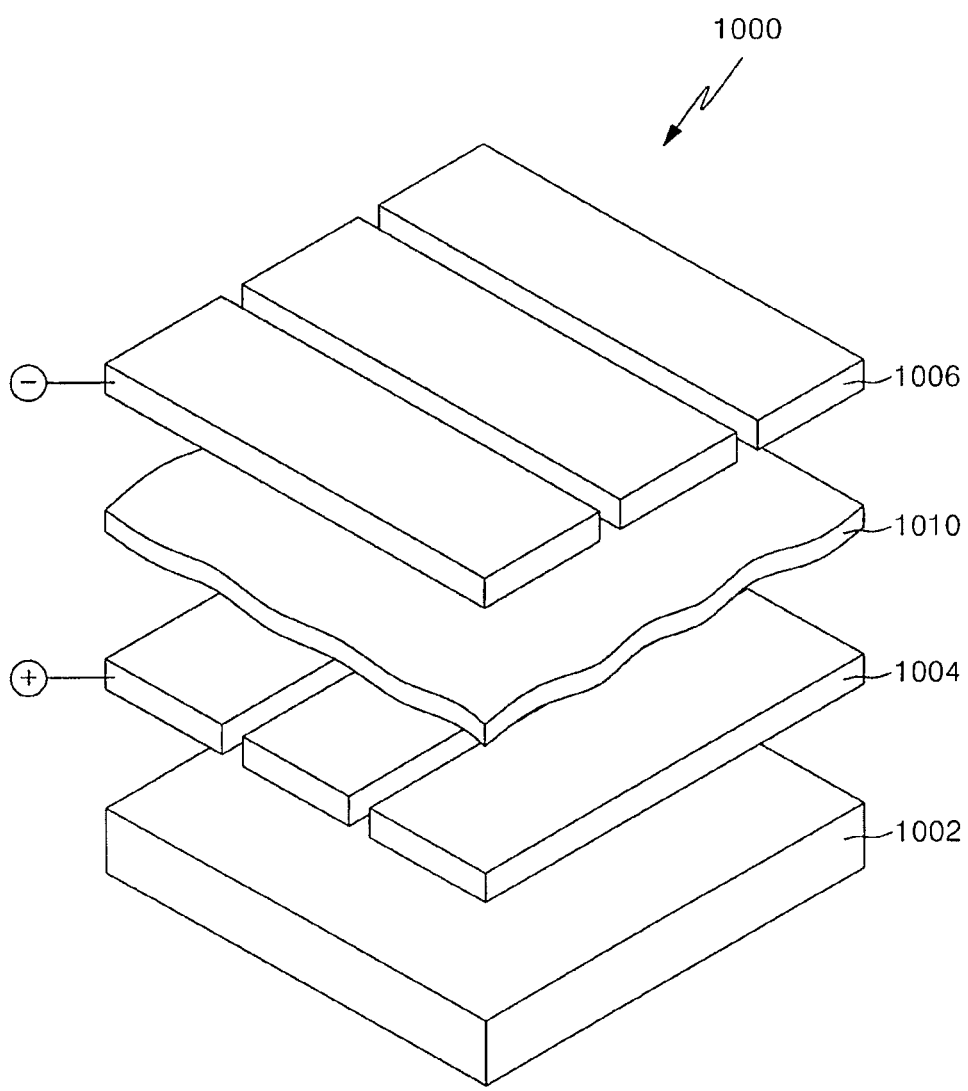
FIG. 7A is a schematic exploded view of a passive matrix type organic light emitting display device in accordance with one embodiment.
Figure 7B:
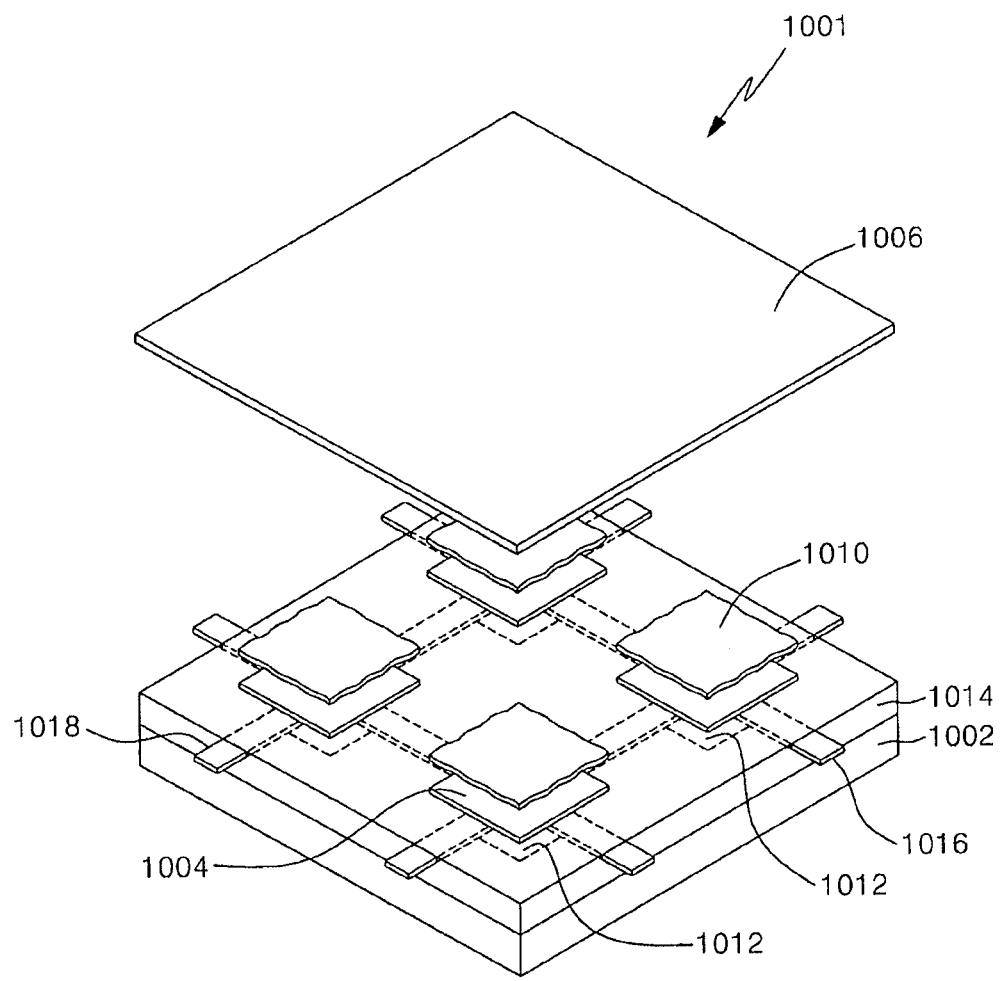
FIG. 7B is a schematic exploded view of an active matrix type organic light emitting display device in accordance with one embodiment.

OLEDs can be generally grouped into two basic types dependent on the arrangement with which the stimulating electrical current is provided. FIG. 7A schematically illustrates an exploded view of a simplified structure of a passive matrix type OLED 1000. FIG. 7B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 7A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 7B, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 7C:
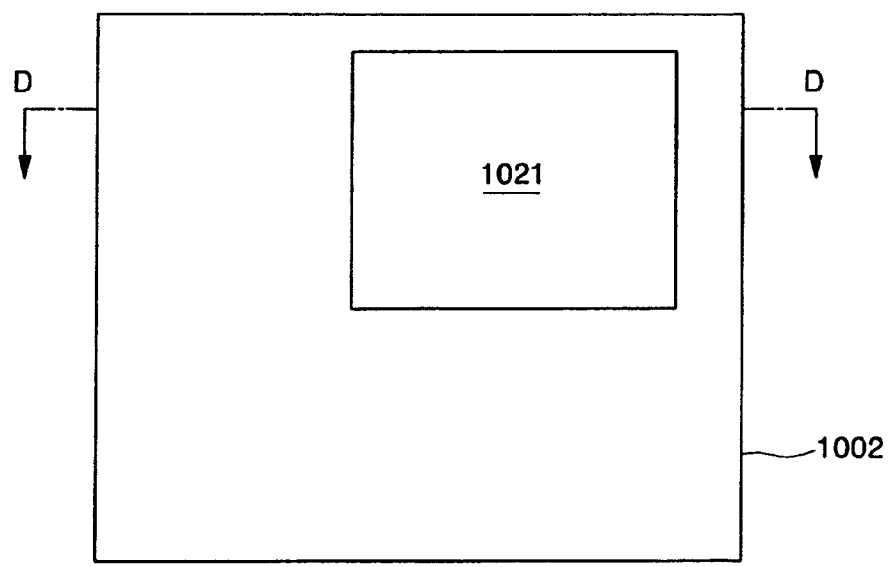
FIG. 7C is a schematic top plan view of an organic light emitting display in accordance with one embodiment.

In many embodiments, an OLED pixel array 1021 comprising a plurality of organic light emitting pixels is arranged over a substrate 1002 as shown in FIG. 7C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 7D:
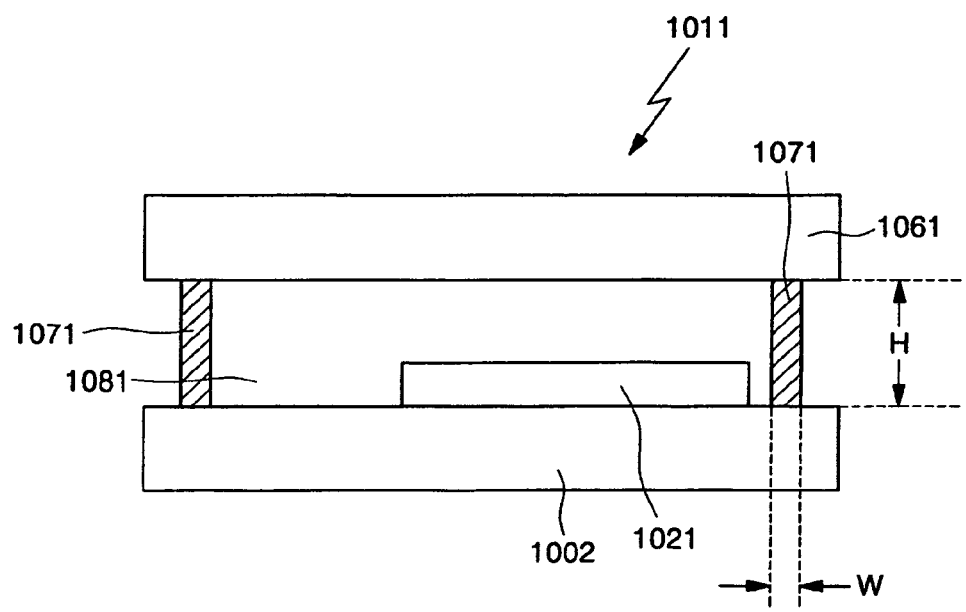
FIG. 7D is a cross-sectional view of the organic light emitting display of FIG. 7C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 7D schematically illustrates a cross-section of an encapsulated OLED device 1011 having a layout of FIG. 7C and taken along the line d-d of FIG. 7C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 7D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 7D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide (Li$_2$O), sodium oxide (Na$_2$O), potassium oxide (K$_2$O), boron oxide (B$_2$O$_3$), vanadium oxide (V$_2$O$_5$), zinc oxide (ZnO), tellurium oxide (TeO$_2$), aluminum oxide (Al$_2$O$_3$), silicon dioxide (SiO$_2$), lead oxide (PbO), tin oxide (SnO), phosphorous oxide (P$_2$O$_5$), ruthenium oxide (Ru$_2$O), rubidium oxide (Rb$_2$O), rhodium oxide (Rh$_2$O), ferrite oxide (Fe$_2$O$_3$), copper oxide (CuO), titanium oxide (TiO$_2$), tungsten oxide (WO$_3$), bismuth oxide (Bi$_2$O$_3$), antimony oxide (Sb$_2$O$_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include ZnSiO$_4$, PbTiO$_3$, ZrO$_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 7E:
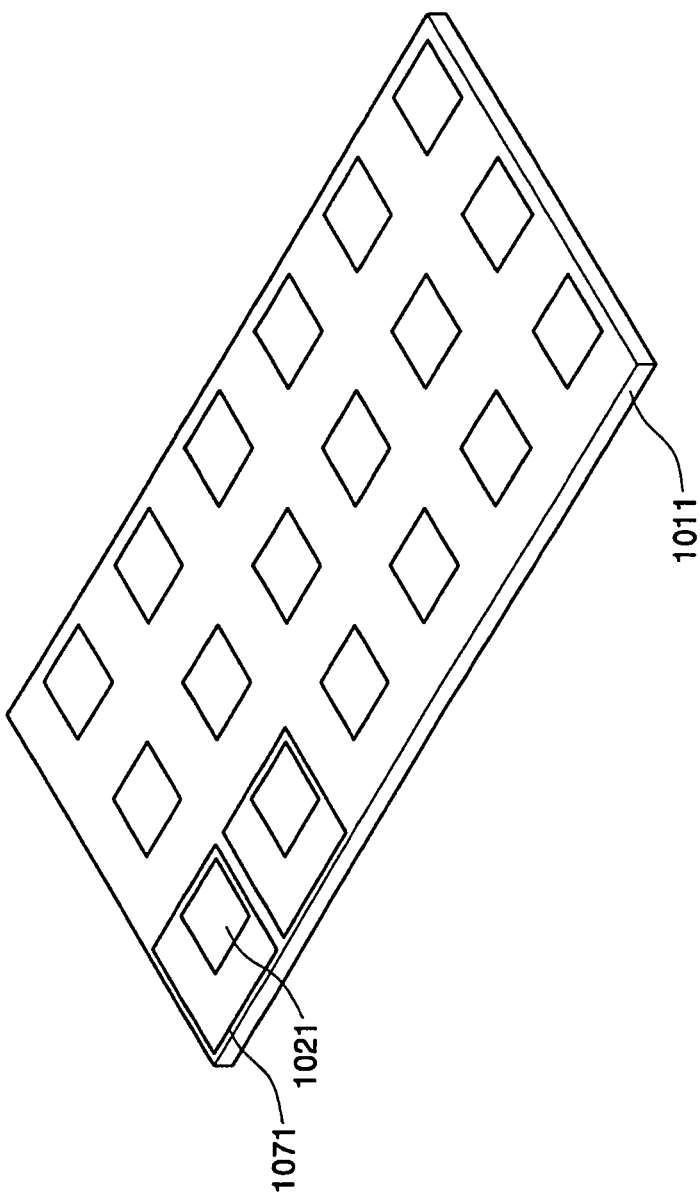
FIG. 7E is a schematic perspective view illustrating mass production of organic light emitting devices in accordance with one embodiment.

In some embodiments, OLED devices 1011 are mass produced. In an embodiment illustrated in FIG. 7E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 7D. In certain embodiments, the individual OLED devices 1011 then further undergo additional packaging operations to further improve the sealing formed by the frit seal 1071 and the top and bottom substrates 1061, 1002.

Figure 1:
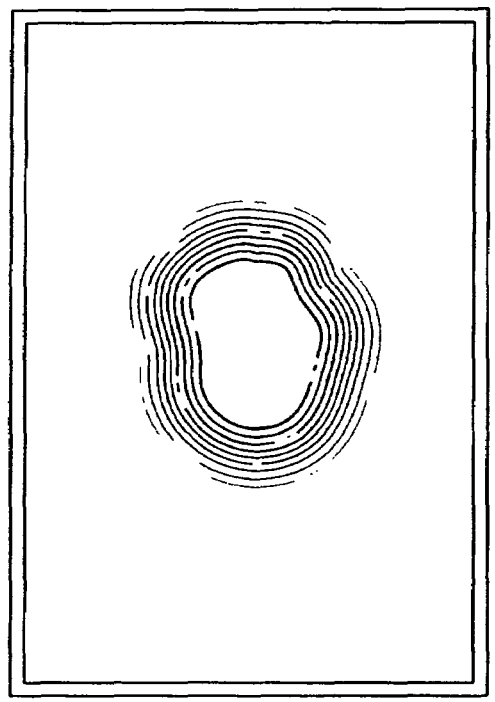
FIG. 1 is an illustration of Newton's rings in an organic light emitting display device (OLED)

A glass frit may be formed in a height of about 14 μm or less. Here, the height refers to the length or thickness of the frit in the direction interconnecting the top and bottom substrates. The top substrate may form a curvature, in which the central portion of the top substrate droops toward the bottom substrate due to its own weight by about 7 to 8 μm. As a result, the air gap between the top substrate and the pixel array may not be uniform, which can cause Newton's rings on the display surface. FIG. 1 shows Newton's rings in an organic light emitting display device (OLED).

Figure 2:
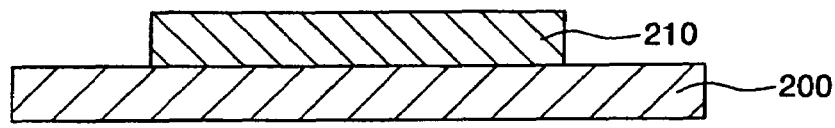
FIGS. 2 and 3 are cross-sectional views of an OLED according to an exemplary embodiment of the present invention.
Figure 3:
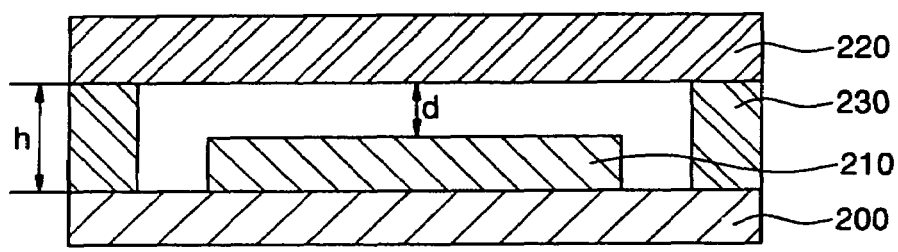

FIGS. 2 and 3 are cross-sectional views of an organic light emitting display device (OLED) according to an exemplary embodiment of the present invention. Referring to FIG. 2, a substrate 200 is equivalent to the bottom plate 1002. The substrate 200 may be an insulating substrate, such as a glass substrate and a plastic substrate, or a conductive substrate. Subsequently, an organic light emitting diode or pixel 210 is formed on the substrate 200. The organic light emitting diode 210 may include a first electrode, an organic layer having at least an emission layer (EML), and a second electrode.

In the organic light emitting diode or pixel 210, the first electrode may be formed of indium tin oxide (ITO) or indium zinc oxide (IZO). Also, when the OLED is a top-emitting OLED, the organic light emitting diode 210 may further include a reflective layer. The organic layer includes at least the EML and may further include at least one of a hole injection layer (HIL), a hole transport layer (HTL), an electron transport layer (ETL), and an electron injection layer (EIL). The second electrode may be formed of a material having a small work function, e.g., at least one selected from the group consisting of Mg, Ag, Al, Ca, and an alloy thereof. Also, the organic light emitting diode 210 may further include a thin film transistor (TFT) having a semiconductor layer, a gate electrode, and source and drain electrodes. The TFT may be a top gate type TFT in which a gate electrode is formed on a semiconductor layer or a bottom gate type TFT in which a gate electrode is formed under a semiconductor layer.

Referring to FIG. 3, an encapsulation substrate 220, which is equivalent to the top plate 1061, is provided opposite to the substrate 200. The encapsulation substrate 220 may be a flat insulating glass substrate. A sealant 230 is formed on the edge of the encapsulation substrate 220. In this case, when the sealant 230 is formed such that, when the substrate 200 is bonded with the encapsulation substrate 220, an air gap "d" between central portions of the substrate 200 and the encapsulation substrate 220 ranges from about 10 to about 300 μm. In one embodiment, the sealant 230 may be formed of an ultraviolet (UV) curable material, for example, acryl-based resin or polyimide-based resin.

In another embodiment, the sealant 230 can be a glass frit. The glass frit may be formed of one selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, and a combination thereof. Also, the glass frit may be formed on the edge of the encapsulation substrate 220 or the edge of the substrate 200 by a screen printing method or a dispensing method.

The organic light emitting display device has a gap between the the top surface of the pixel array and the inner surface of the encapsulation substrate. Generally, the size of the gap depends on the height of the seal interconnecting two substrates. The frit seal, among other forms of sealing, allows the gap size significantly smaller than others. For example, when using frit seal, the gap size (the distance between the array and the encapsulation substrate) can be in the order of a few µm to several hundred µm. When the gap size is in this range, dark rings called Newton's rings may be formed on the display surface due to optical interference created by light incident to the display surface. More specifically, when the gap size is about or less than 10 µm, the possibility of Newton's rings increases. Thus, in packaging an organic light emitting display device with the frit seal, the size of the gap can be a design factor in view of the Newton's rings. In one embodiment, the gap size is greater than about 10 µm. Optionally, the gap size is from about 10 to about 300 µm, further optionally from about 10 to about 30 µm. In certain embodiments, the gap size is about 10, 11, 12, 13, 14, 15, 16, 17, 18, 19, 20, 21, 22, 23, 24, 25, 26, 27, 28, 29, 30, 32, 34, 36, 38, 40, 43, 46, 50, 55, 60, 65, 70, 80, 90, 100, 120, 150, 200, 250 or 300 µm.

In one embodiment, the substrate 200 on which the organic light emitting diode 210 is formed and the encapsulation substrate 220 on which the sealant 230 is formed are aligned and then bonded to each other. In this case, the substrate 200 and the encapsulation substrate 220 are bonded to each other such that the air gap "d" between a top surface of the substrate 200 on which an array of the organic light emitting diodes or pixels 210 is formed and the central portion of the encapsulation substrate 220 is about 10 µm or more, preferably, ranges from about 10 to about 300 µm. In this case, the sealant 230, which is formed of a UV curable material or glass frit, may have a height h of 10 to 300 µm.

Subsequently, in one embodiment, when the sealant 230 includes the UV curable material, the UV curable material is cured with UV irradiation. Also, in an embodiment, when the sealant 230 is the glass frit, the glass frit is melted by laser irradiation and solidified. Thereby, the OLED according to an embodiment of the present invention is completed.

In the OLED fabricated according to the exemplary embodiment of the present invention, the substrate 200 on which the organic light emitting diode 210 is formed is bonded to the encapsulation substrate 200 such that the air gap "d" between the top surface of the substrate 200, particularly at the central portions of the substrate 200, and the encapsulation substrate 220 ranges from about 10 to about 300 µm, thereby preventing Newton's rings from occurring and thereby improving image quality.

Figure 4:
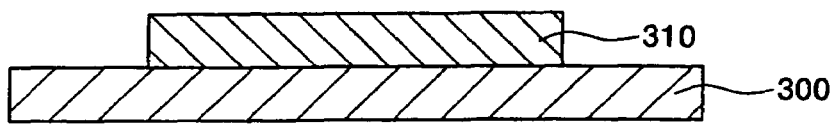
FIGS. 4 and 5 are cross-sectional views of an OLED according to another exemplary embodiment of the present invention.
Figure 5:
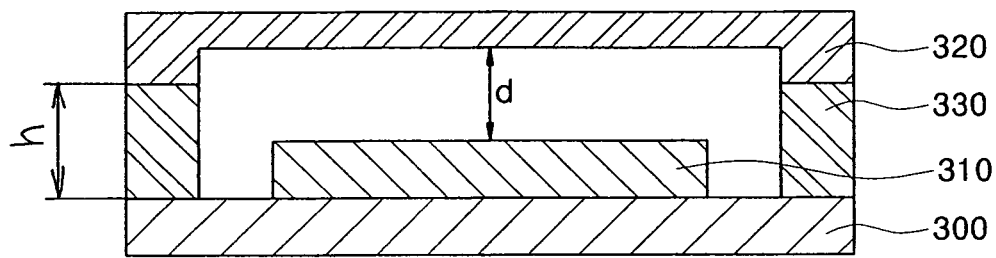

FIGS. 4 and 5 are cross-sectional views of an OLED according to another exemplary embodiment of the present invention. Referring to FIG. 4, a substrate 300 is provided. The substrate 300 may be an insulating substrate, such as a glass substrate or a plastic substrate, or a conductive substrate. Subsequently, an organic light emitting diode 310 is formed on the substrate 300. The organic light emitting diode 310 may include a first electrode, an organic layer having at least an EML, and a second electrode.

In the organic light emitting diode 310, the first electrode may be formed of ITO or IZO. Also, when the OLED is a top-emitting OLED, the organic light emitting diode 310 may further include a reflective layer. The organic layer includes at least the EML and may further include at least one of a hole injection layer (HIL), a hole transport layer (HTL), an electron transport layer (ETL), and an electron injection layer (EIL). The second electrode may be formed of a material having a small work function, e.g., at least one selected from the group consisting of Mg, Ag, Al, Ca, and an alloy thereof. Also, the organic light emitting diode 310 may further include a TFT having a semiconductor layer, a gate electrode, and source and drain electrodes. The TFT may be a top gate type TFT in which a gate electrode is formed on a semiconductor layer or a bottom gate type TFT in which a gate electrode is formed under a semiconductor layer.

Referring to FIG. 5, an encapsulation substrate 320 is provided opposite to the substrate 300. The encapsulation substrate 320 may be an etched insulating glass substrate. Specifically, when the encapsulation substrate 320 is bonded to the substrate 300 later, the encapsulation substrate 320 may be etched such that an air gap "d" between a top surface of the substrate 300 and a central portion of the encapsulation substrate 320 ranges about 10 to about 300 µm. By etching the encapsulation substrate 320 in order to keep the air gap "d" between the top surface of the substrate 300 and the central portion of the encapsulation substrate 320 about 10 µm or more, the glass frit can have a small height.

Thereafter, a glass frit 330 is formed on the edge of the encapsulation substrate 320. The glass frit 330 may be formed of one selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, and a combination thereof. Also, the glass frit 330 may be formed on the edge of the encapsulation substrate 320 or the edge of the substrate 300 by a screen printing method or a dispensing method.

Thereafter, the substrate 300 on which the organic light emitting diode 310 is formed and the encapsulation substrate 320 on which the glass frit 330 is formed are aligned and then bonded to each other. In an embodiment, the substrate 300 and the encapsulation substrate 320 are bonded to each other such that the air gap "d" between the top surface of the substrate 300 on which the organic light emitting diode 310 is formed and the central portion of the encapsulation substrate 320 is about 10 µm or more, preferably, ranges from about 10 to about 300 µm. In an embodiment, the height h of the glass frit 330 may range from about 10 to about 300 µm. Also, since the glass frit 330 with the height of about 300 µm or less can be formed by melting by laser irradiation and solidifying.

Subsequently, the glass frit 330 is melted by laser irradiation and solidified, so that the OLED according to another exemplary embodiment of the present invention can be completed. In the OLED according to another exemplary embodiment of the present invention, the encapsulation substrate 320 may be etched such that the air gap "d" between the central portions of the substrate 300 and the encapsulation substrate 320 ranges from about 10 to about 300 µm, thereby preventing Newton's rings from occurring and improving image quality.

Hereinafter, an experimental example is presented. However, the present invention should not be construed as being limited to the experimental example set forth herein. Rather, the experimental example is provided to facilitate understanding.

EXAMPLE

Figure 6:
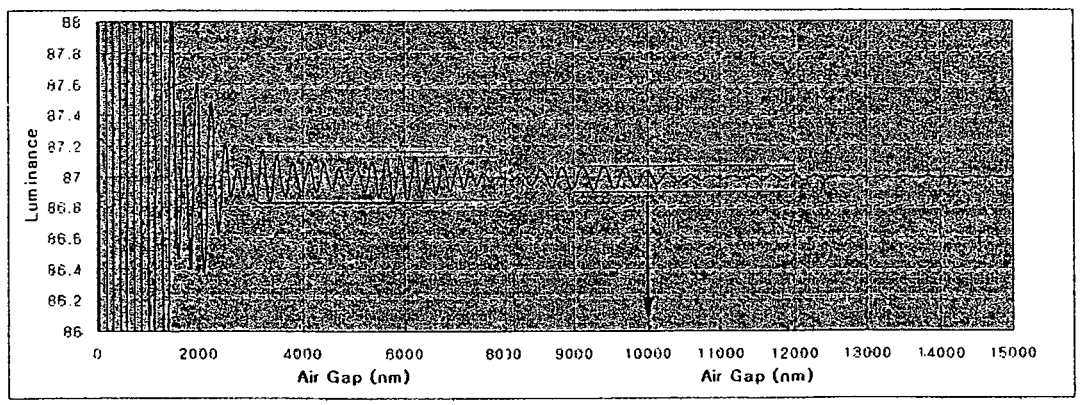
FIG. 6 is a graph of luminance versus an air gap between a substrate and an encapsulation substrate.

FIG. 6 is a graph of luminance versus an air gap between a substrate and an encapsulation substrate. In FIG. 6, an abscissa denotes an air gap "d" between the top surface of an array at the central portions of a substrate on which the array of organic light emitting diodes is formed and an encapsulation substrate, which is expressed in nanometers (nm), and an ordinate denotes luminance of Newton's rings versus the air gap "d". Referring to FIG. 6, it can be seen that as the air gap "d" between the substrate on which the organic light emitting diode is formed and the encapsulation substrate increases, variation in the intensity of the Newton's rings, which is shown as amplitude, gradually decreases. Further, when the air gap "d" between the substrate and the encapsulation substrate exceeds about 10000 nm (i.e., 10 μm), the amplitude becomes fine.

Specifically, light reflected on the encapsulation substrate interferes with light that passes through the encapsulation substrate and is reflected on the substrate on which the organic light emitting diode is formed, so that destructive interference causes dark patterns, and constructive interference causes bright patterns. In this case, repetition of the dark and bright patterns is referred to as a Newton's rings. Thus, the amplitude refers to a difference in luminance between the dark and bright patterns of the Newton's rings. Accordingly, a reduction in the amplitude can be understood as a reduction in a difference in luminance between the dark and bright patterns of the Newton's rings.

Therefore, when the air gap "d" between the top surface of the substrate on which the organic light emitting diode is formed and the encapsulation substrate is more than about 10000 nm (i.e., 10 μm), the amplitude is scarcely distinguishable by the naked eye. Thus, the Newton's rings cannot be easily observed by the naked eye. Based on the above-described result, it can be concluded that when the air gap "d" between the central portions of the substrate on which the organic light emitting diode is formed and the encapsulation substrate is made to about 10 μm or more, the Newton's rings can be prevented. As described above, an OLED and a method of fabricating the same according to the present invention can prevent Newton's rings to improve image quality when a substrate and an encapsulation substrate are bonded to each other.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting display device, comprising:
a first substrate comprising a single layer or multiple layers;
a second substrate comprising a single layer or multiple layers, the second substrate comprising an inner surface facing the first substrate;
an array of organic light emitting pixels formed on the first substrate and interposed between the first and second substrates, the array comprising a top surface opposing the inner surface of the second substrate, wherein the top surface and the inner surface has a gap therebetween, and the gap has a gap distance measured between the top surface and the inner surface wherein the gap distance is equal to or greater than 10 μm, said array comprising elongate strips of anode and elongate strips of cathode where the elongate strips of anode are arranged generally perpendicular to the elongate strips of cathode, and wherein each pixel is defined by the intersections of the elongate strips of anode and the elongate strips of cathode and an organic layer interposed therebetween; and
a frit seal interconnecting the first and second substrates while surrounding the array, wherein the frit seal, the first substrate and the second substrate in combination define an enclosed space in which the array is located, wherein the frit seal has a height between the first and second substrates from about 2 to about 300 μm and the frit seal is prepared from a frit paste comprising about 10-30 wt % organic materials and about 70-90 wt % inorganic materials where the organic materials comprise 0-30 wt % binder(s) and about 70-100 wt % solvent(s), and wherein the enclosed space does not include a desiccant.

2. The device of claim 1, wherein the gap distance is about 10 to about 300 μm.

3. The device of claim 1, wherein the gap distance is from about 10 to about 100 μm.

4. The device of claim 1, wherein the gap distance is from about 10 to about 30 μm.

5. The device of claim 1, wherein the array is configured to emit visible light through the top surface.

6. The device of claim 1, wherein the inner surface of the second substrate is uncoated.

7. The device of claim 1, wherein the second substrate comprises a display surface facing away from the first substrate and configured to display an image thereon, and wherein the device is configured to display an image on the display surface substantially free of Newton's rings.

8. The device of claim 1, wherein the array comprises a first electrode, a second electrode and at least one organic layer interposed therebetween, wherein the second electrode is closer to the second substrate than the first electrode, and wherein the top surface comprises a surface of the second electrode facing the second substrate.

9. The device of claim 1, wherein the array comprises a first electrode, a second electrode and at least one organic layer interposed therebetween, wherein the second electrode is closer to the second substrate than the first electrode, wherein the array further comprises a substantially transparent layer formed on the second electrode, and wherein the top surface comprises a surface of the substantially transparent layer which faces the second substrate.

10. The device of claim 1, wherein the gap comprises an air gap.

11. The device of claim 1, wherein the gap is substantially filled with a solid material.

12. The device of claim 1, wherein the inorganic materials consist of one or more materials selected from the group consisting of magnesium oxide (MgO), calcium oxide (CaO), barium oxide (BaO), sodium oxide ($Na_2O$), tellurium oxide ($TeO_2$), ruthenium oxide ($Ru_2O$), rubidium oxide ($Rb_2O$), rhodium oxide ($Rh_2O$), copper oxide (CuO), tin-phosphate glass, and borosilicate.

13. An organic light emitting display device, comprising:
a first substrate;
a second substrate comprising an inner surface facing the first substrate;
an array of organic light emitting pixels formed on the first substrate, the array comprising a top surface opposing the inner surface of the second substrate, wherein the top surface and the inner surface has a gap therebetween from about 10 to about 300 μm, said array comprising elongate strips of anode and elongate strips of cathode where the elongate strips of anode are arranged generally perpendicular to the elongate strips of cathode, and wherein each pixel is defined by the intersections of the elongate strips of anode and the elongate strips of cathode and an organic layer interposed therebetween; and a frit seal interconnecting the first and second substrates while surrounding the array, wherein the frit seal, the first substrate and the second substrate in combination define an enclosed space in which the array is located and the frit seal is prepared from a frit paste comprising about 10-30 wt % organic materials and about 70-90 wt % inorganic materials where the organic materials comprise 0-30 wt % binder(s) and about 70-100 wt % solvent(s), wherein the enclosed space does not include a desiccant.

14. The device of claim 1, wherein the frit seal has a width of about 300 μm.

15. The device of claim 1, wherein the frit seal has a width of about 3000 μm.

16. The device of claim 1, wherein the frit seal has a width of about 1500 μm.

17. The device of claim 1, wherein the frit seal has a width of about 500 μm.

18. The device of claim 8, wherein the first electrode is formed of indium zinc oxide.

19. An organic light emitting display device, comprising:

a first substrate comprising a single layer or multiple layers;

a second substrate comprising a single layer or multiple layers, the second substrate comprising an inner surface facing the first substrate, wherein the inner surface of the second substrate is uncoated;

an array of organic light emitting pixels formed on the first substrate and interposed between the first and second substrates, the array comprising a top surface opposing the inner surface of the second substrate, wherein the top surface and the inner surface has a gap therebetween, and the gap has a gap distance measured between the top surface and the inner surface wherein the gap distance is about 10 to about 300 μm, and wherein each pixel comprises a cathode, an anode and an organic layer interposed therebetween;

a driving circuit;

a scan line;

a data line, where the driving circuit is coupled with the data line and the scan line, and the scan line is between the driving circuit and the anode; and a frit seal interconnecting the first and second substrates while surrounding the array, wherein the frit seal, the first substrate and the second substrate in combination define an enclosed space in which the array is located, wherein the frit seal has a height between the first and second substrates from about 2 to about 300 μm and the frit seal is prepared from a frit paste comprising about 10-30 wt % organic materials and about 70-90 wt % inorganic materials where the organic materials comprise 0-30 wt % binder(s) and about 70-100 wt % solvent(s), and wherein the enclosed space does not include a desiccant.

20. The device of claim 19, wherein the frit seal has a height between the first and second substrates from 2 to 10 μm.

* * * * *

UNITED STATES PATENT AND TRADEMARK OFFICE
CERTIFICATE OF CORRECTION

PATENT NO. : 8,729,796 B2
APPLICATION NO. : 11/529891
DATED : May 20, 2014
INVENTOR(S) : Choi et al.

It is certified that error appears in the above-identified patent and that said Letters Patent is hereby corrected as shown below:

On the Title Page

Insert --(30)    Foreign Application Priority Data

Jan. 25, 2006   (KR).......................10-2006-0007963--.

In column 1 (page 4, item 56) at line 12, Under OTHER PUBLICATIONS, change "Japananese" to --Japanese--.

In column 1 (page 4, item 56) at line 70, Under OTHER PUBLICATIONS, change "Sep. 20, 2006," to --Sep. 29, 2006,--.

In column 2 (page 4, item 56) at line 14, Under OTHER PUBLICATIONS, change "potentally" to --potentially--.

In column 2 (page 4, item 56) at lines 23-24, Under OTHER PUBLICATIONS, change "2007/0170857" to --2007/0170859--.

In column 2 (page 4, item 56) at lines 27-28, Under OTHER PUBLICATIONS, change "2007/0170859" to --2007/0170860--.

In column 2 (page 4, item 56) at line 28, Under OTHER PUBLICATIONS, change "prosection" to --prosecution--.

In column 2 (page 4, item 56) at line 29, Under OTHER PUBLICATIONS, change "limitaton" to --limitation--.

In column 2 (page 4, item 56) at lines 31-32, Under OTHER PUBLICATIONS, change "2007/0170860" to --2007/0170861--.

In column 2 (page 4, item 56) at lines 43-44, Under OTHER PUBLICATIONS, change "2007/0167549" to --2007/0176549--.

In column 2 (page 4, item 56) at line 52, Under OTHER PUBLICATIONS, change "prosectuion" to --prosecution--.

Signed and Sealed this
Eleventh Day of November, 2014

Michelle K. Lee
*Deputy Director of the United States Patent and Trademark Office*

In the Specification

In column 9 at line 24, Change "cellusolve," to --cellosolve,--.

In column 11 at line 2, Change "the the" to --the--.